(12) United States Patent
Sills et al.

(10) Patent No.: US 8,247,302 B2
(45) Date of Patent: *Aug. 21, 2012

(54) METHODS OF FABRICATING SUBSTRATES

(75) Inventors: Scott Sills, Boise, ID (US); Gurtej S. Sandhu, Boise, ID (US); Anton deVilliers, Boise, ID (US)

(73) Assignee: Micron Technology, Inc., Boise, ID (US)

(*) Notice: Subject to any disclaimer, the term of this patent is extended or adjusted under 35 U.S.C. 154(b) by 719 days.

This patent is subject to a terminal disclaimer.

(21) Appl. No.: 12/328,464

(22) Filed: Dec. 4, 2008

(65) Prior Publication Data

US 2010/0144153 A1 Jun. 10, 2010

(51) Int. Cl.
*H01L 21/331* (2006.01)
*H01L 21/8222* (2006.01)
(52) U.S. Cl. ........ 438/312; 438/313; 438/323; 438/394; 438/551; 438/669; 438/700; 438/717
(58) Field of Classification Search .................. None
See application file for complete search history.

(56) References Cited

U.S. PATENT DOCUMENTS

| | | | |
|---|---|---|---|
| 5,047,117 A | 9/1991 | Roberts | |
| 5,254,218 A | 10/1993 | Roberts et al. | |
| 5,328,810 A | 7/1994 | Lowrey et al. | |
| 5,372,916 A | 12/1994 | Ogawa et al. | |
| 5,382,315 A * | 1/1995 | Kumar | 216/39 |
| 5,420,067 A * | 5/1995 | Hsu | 438/700 |
| 5,429,988 A * | 7/1995 | Huang et al. | 438/587 |
| 5,573,837 A | 11/1996 | Roberts et al. | |
| 5,593,813 A | 1/1997 | Kim | |
| 5,905,279 A | 5/1999 | Nitayama et al. | |
| 6,063,688 A | 5/2000 | Doyle et al. | |
| 6,087,263 A * | 7/2000 | Clampitt et al. | 438/700 |
| 6,140,217 A | 10/2000 | Jones et al. | |
| 6,207,490 B1 | 3/2001 | Lee | |
| 6,235,574 B1 | 5/2001 | Tobben et al. | |

(Continued)

FOREIGN PATENT DOCUMENTS

CN 1761063 4/2006

(Continued)

OTHER PUBLICATIONS

A Flexible Gate Array Architecture for High-speed and High-Density Applications; Mar. 1996 Gallia et al.; 430-436.

(Continued)

*Primary Examiner* — Duy Deo
(74) *Attorney, Agent, or Firm* — Wells St. John, P.S.

(57) ABSTRACT

A method of fabricating a substrate includes forming spaced first features and spaced second features over a substrate. The first and second features alternate with one another and are spaced relative one another. Width of the spaced second features is laterally trimmed to a greater degree than any lateral trimming of width of the spaced first features while laterally trimming width of the spaced second features. After laterally trimming of the second features, spacers are formed on sidewalls of the spaced first features and on sidewalls of the spaced second features. The spacers are of some different composition from that of the spaced first features and from that of the spaced second features. After forming the spacers, the spaced first features and the spaced second features are removed from the substrate. The substrate is processed through a mask pattern comprising the spacers. Other embodiments are disclosed.

37 Claims, 11 Drawing Sheets

U.S. PATENT DOCUMENTS

| | | |
|---|---|---|
| 6,249,335 B1 | 6/2001 | Hirukawa et al. |
| 6,352,932 B1 | 3/2002 | Clampitt et al. |
| 6,383,952 B1 | 5/2002 | Subramanian et al. |
| 6,483,136 B1 | 11/2002 | Yoshida et al. |
| 6,545,904 B2 | 4/2003 | Tran |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,735,132 B2 | 5/2004 | Siek |
| 6,753,220 B2 | 6/2004 | Juengling |
| 6,756,619 B2 | 6/2004 | Tran |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,905,975 B2 | 6/2005 | Boettiger et al. |
| 6,916,594 B2 | 7/2005 | Bok et al. |
| 6,951,822 B2 | 10/2005 | Scholz |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,320,911 B2 | 1/2008 | Basceri et al. |
| 7,387,939 B2 | 6/2008 | Manning |
| 7,390,749 B2 | 6/2008 | Kim et al. |
| 7,390,750 B1 * | 6/2008 | Ramkumar et al. .......... 438/706 |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,790,360 B2 | 9/2010 | Alapati et al. |
| 7,842,601 B2 | 11/2010 | Lee et al. |
| 7,851,135 B2 | 12/2010 | Jung et al. |
| 8,083,953 B2 | 12/2011 | Millward et al. |
| 8,083,958 B2 | 12/2011 | Li et al. |
| 2002/0037617 A1 | 3/2002 | Kim et al. |
| 2002/0094688 A1 | 7/2002 | Mitsuiki |
| 2003/0001214 A1 | 1/2003 | Yoshida et al. |
| 2003/0006410 A1 | 1/2003 | Doyle |
| 2003/0091936 A1 | 5/2003 | Rottstegge et al. |
| 2004/0043546 A1 | 3/2004 | Yoshida et al. |
| 2004/0198065 A1 | 10/2004 | Lee et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jim |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0088788 A1 | 4/2006 | Kudo et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0273456 A1 | 12/2006 | Sant et al. |
| 2006/0278911 A1 | 12/2006 | Eppich |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Raghu et al. |
| 2008/0113483 A1 | 5/2008 | Wells |
| 2008/0113511 A1 | 5/2008 | Park et al. |
| 2008/0120900 A1 | 5/2008 | O'Neal et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0220600 A1 | 9/2008 | Alapati et al. |
| 2008/0254627 A1 | 10/2008 | Wells |

| | | | |
|---|---|---|---|
| 2008/0261349 | A1 | 10/2008 | Abatchev et al. |
| 2008/0292991 | A1 | 11/2008 | Wallow et al. |
| 2008/0296732 | A1 | 12/2008 | Olson |
| 2008/0305636 | A1 | 12/2008 | Kim et al. |
| 2009/0074958 | A1 | 3/2009 | Xiao |
| 2009/0117739 | A1 | 5/2009 | Shin et al. |
| 2009/0130612 | A1 | 5/2009 | Yang |
| 2009/0130852 | A1 | 5/2009 | Kewley |
| 2009/0212016 | A1 | 8/2009 | Cheng et al. |
| 2009/0291397 | A1 | 11/2009 | deVilliers |
| 2010/0009512 | A1 | 1/2010 | Fishburn |
| 2010/0068656 | A1 | 3/2010 | Yeh et al. |
| 2010/0081265 | A1 | 4/2010 | Mashita et al. |
| 2010/0130015 | A1 | 5/2010 | Nakajima et al. |
| 2010/0130016 | A1 | 5/2010 | deVilliers |
| 2010/0144150 | A1 | 6/2010 | Sills et al. |
| 2010/0144151 | A1 | 6/2010 | Sills et al. |
| 2010/0203740 | A1 | 8/2010 | Li |

FOREIGN PATENT DOCUMENTS

| | | |
|---|---|---|
| EP | 0171111 | 2/1986 |
| JP | 46046531 | 4/1981 |
| JP | 58157135 | 9/1983 |
| JP | 59211231 | 11/1984 |
| JP | 06-077180 | 3/1994 |
| JP | 2002-217170 | 8/2002 |
| JP | 2003234279 | 8/2003 |
| JP | 2004247399 | 9/2004 |
| JP | 2006245625 | 9/2006 |
| KR | 20030049198 | 6/2003 |
| KR | 20030056601 | 7/2003 |
| KR | 20030089063 | 11/2003 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 B1 | 12/2007 |
| KR | 10-2008-0039006 | 5/2008 |
| WO | WO2007/027558 | 3/2007 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/06978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |

OTHER PUBLICATIONS

PCT/US2009/039793; Search Report mailed Oct. 30, 2009; 4 pp.
PCT/US2009/039793; Written Opinion mailed Oct. 30, 2009; 5 pp.
PCT/US2009/041500; Search Report mailed Dec. 7, 2009; 3 pp.
PCT/US2009/041500; Written Opinion mailed Dec. 7, 2009; 3 pp.
PCT/US2007/015729; Search Report mailed Jan. 2, 2008; 3 pp.
PCT/US2007/015729; Written Opinion mailed Jan. 2, 2008; 7 pp.
Innovative Solutions to Enhance the Legacy Equipments Towards "One Generation ahead" in Flip chip BGA 0.8mm Ball Pitch Technology; Sep. 2005; EE et al.; 4 pp.
Polysilazane SODs Spinful 400 Series for STI/PMD Application; Clariant; At least as early as Oct. 19, 2009; 1 pp.
Advanced cell Structures for Dynamic RAMs; Jan. 1989; Lu; pp. 27-36.
Alapati et al., U.S. Appl. No. 11/714,378, filed Mar. 5, 2007, "Preliminary Amendment filed Mar. 5, 2007", 13 pgs.
Terai et al., "Newly developed RELACS process and materials for 65nm node device and beyond", website: ieeexplore.ieee.org/iel5/10631/33565/01595193.pdf, pp. 20-21.
U.S. Appl. No. 13/101,485, filed May 5, 2011, Light et al.
U.S. Appl. No. 12/125,725, As-Filed.
U.S. Appl. No. 12/328,435, As-Filed.
U.S. Appl. No. 12/328,448, As-Filed.
Fritze et al., "Enhanced Resolution for Future Fabrication", IEEE Circuits & Devices magazine, Jan. 2003, pp. 43-47.
Hori et al., "Sub-40nm Half-Pitch Double Patterning with Resist Freezing Process", Proc. of SPIE vol. 6923 (2008) pp. 69230H-1 through 69230H-8.
Lee et al., "Double-Patterning Technique Using Plasma Treatment of Photoresist", Japanese Journal of Applied Physics, vol. 46, No. 9B, 2007, pp. 6135-6139.
Liau et al., "Softbake and Post-exposure Bake Optimization for Process Window Improvement and Optical Proximity Effect Tuning", ICSE 2006 Proc. 2006, Kuala Lumpur, Malaysia, 7 pgs.
Ma, "Plasma Resist Image Stabilization Technique (PRIST)", IEEE 1980, pp. 574-575.
Owa et al., "Immersion Lithography Ready for 45nm Manufacturing and Beyond", 2007 IEEE/SEMI Advanced Semiconductor Manufacturing Conference, pp. 238-244.
Pease et al., "Lithography and Other Patterning Techniques for Future Electronics", Proceedings of the IEEE/vol. 96, No. 2, Feb. 2008, pp. 248-270.
Tan et al., "Current Status of Nanonex Nanoimprint Solutions", website: www.nanonex.com/technology.htm 2004, 9 pgs.
Terai et al., "Newly developed RELACS process and materials for 65nm node device and beyond", website: ieeexplore.ieee.org/iel5/10631/33565/01595193.pdf, pp. 20-21, 2005.

* cited by examiner

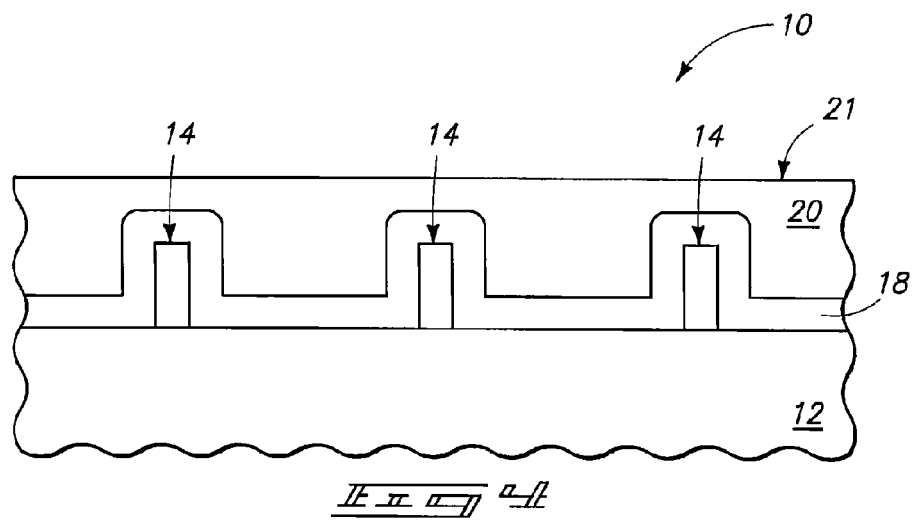
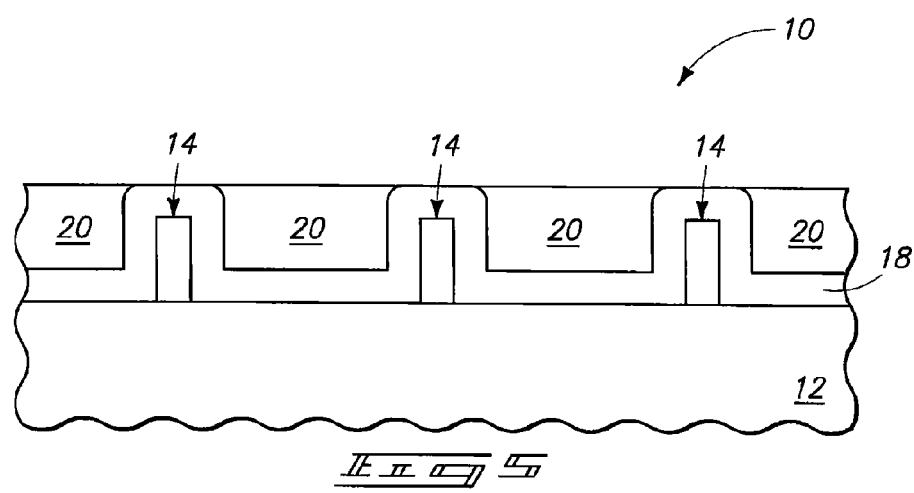
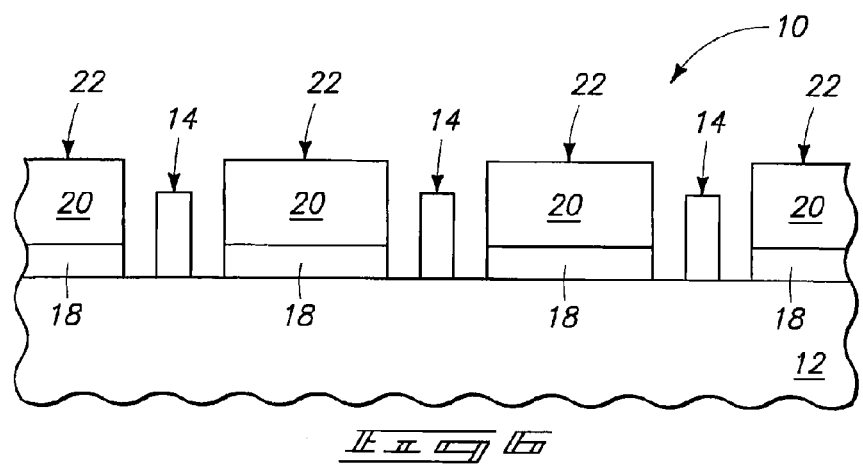

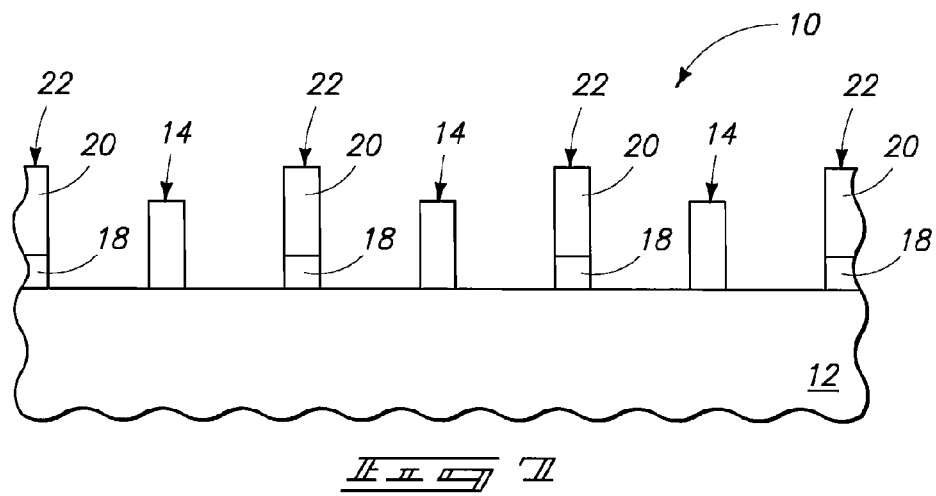
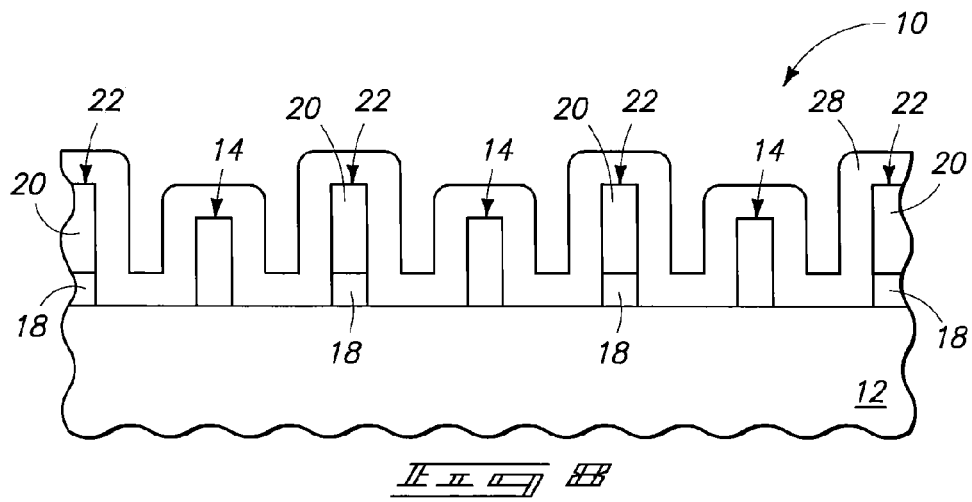
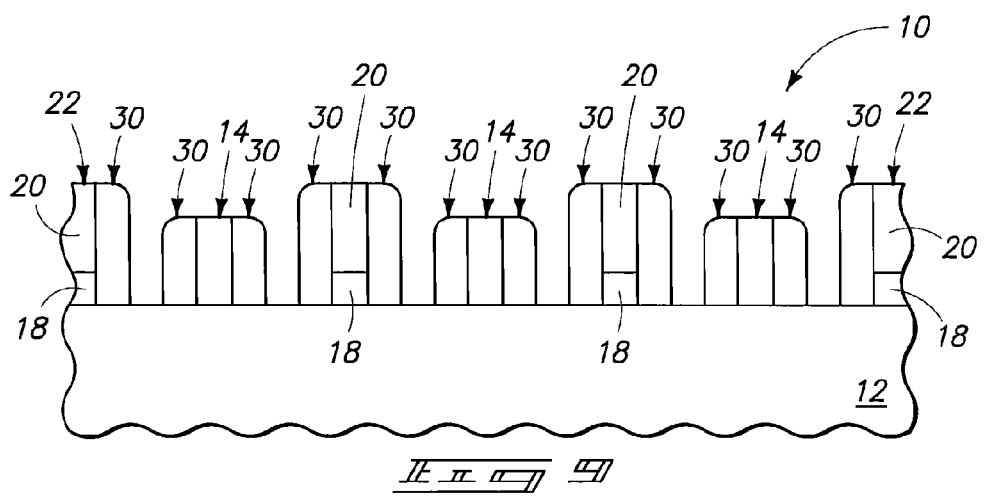

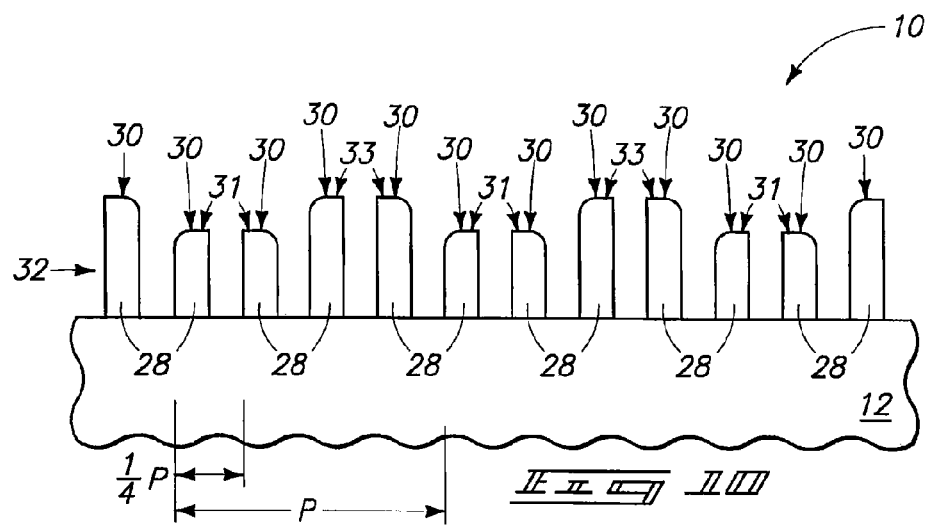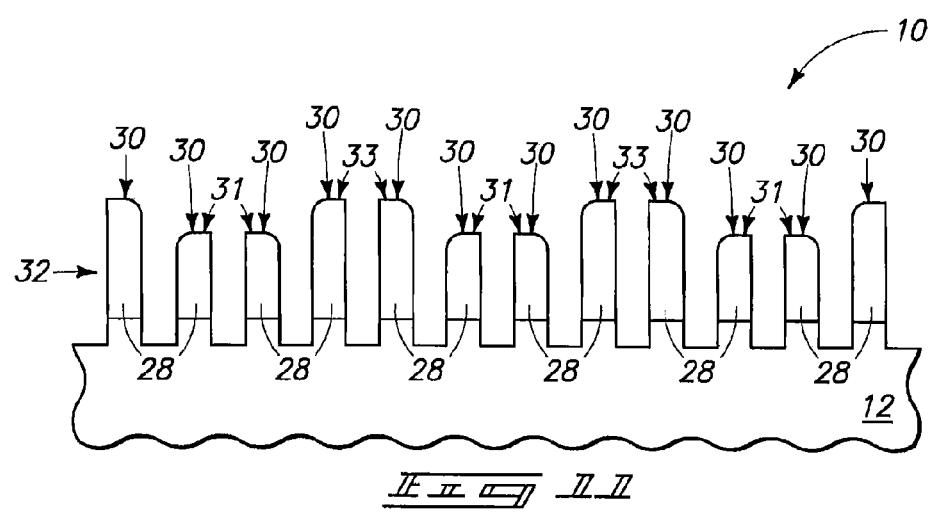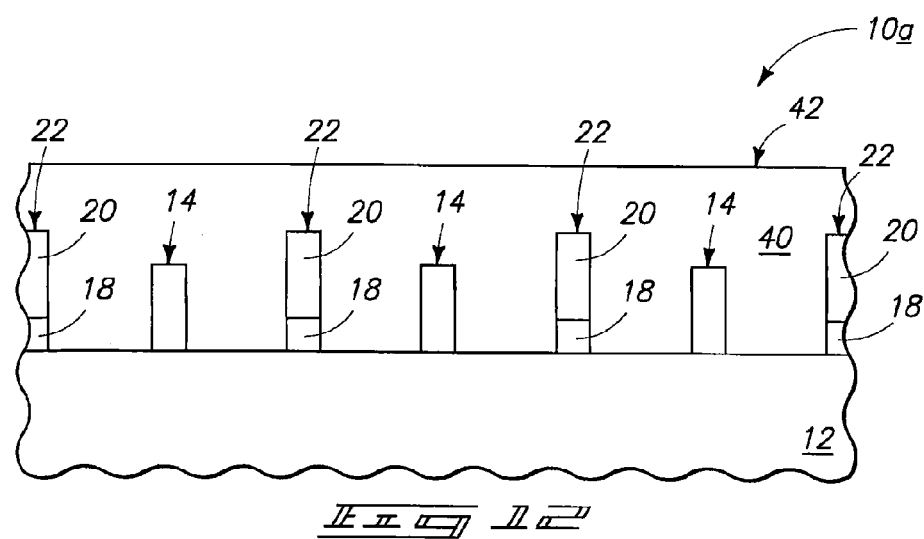

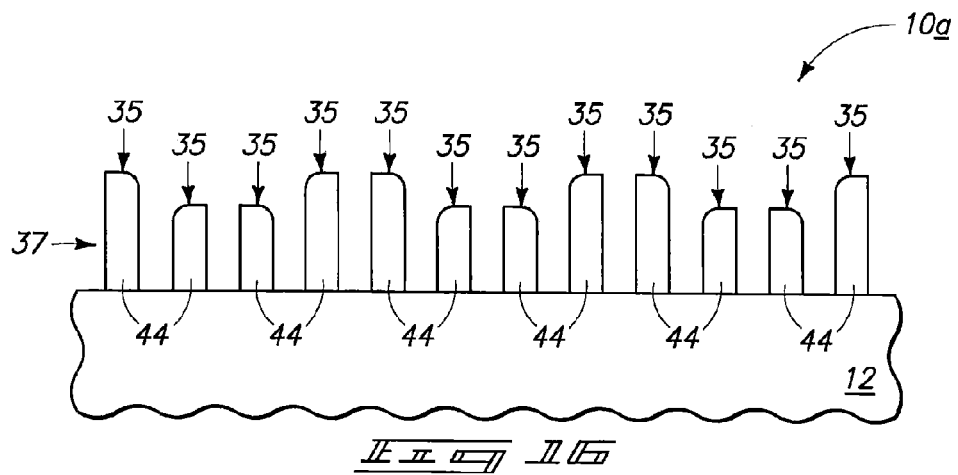
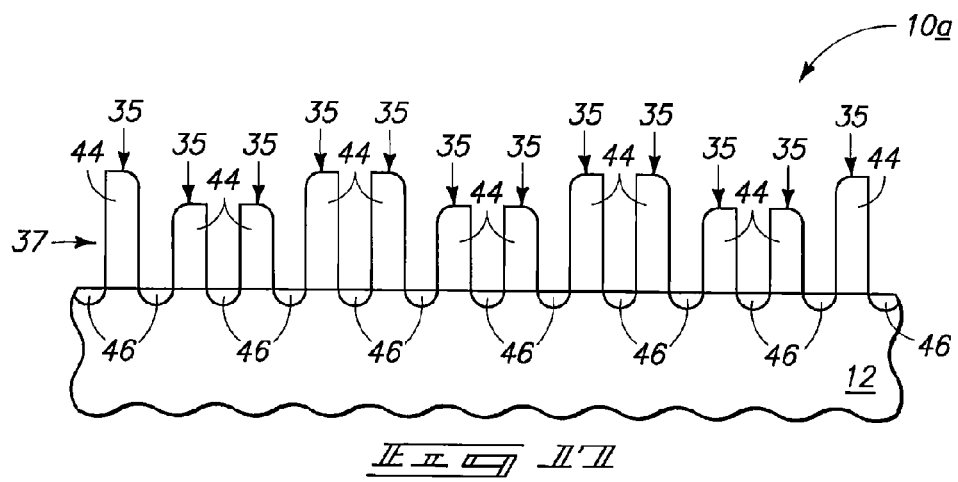
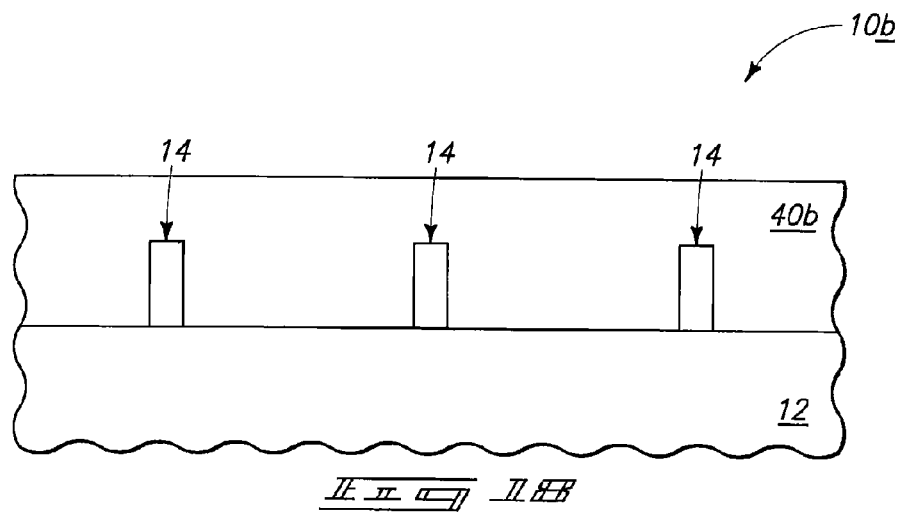

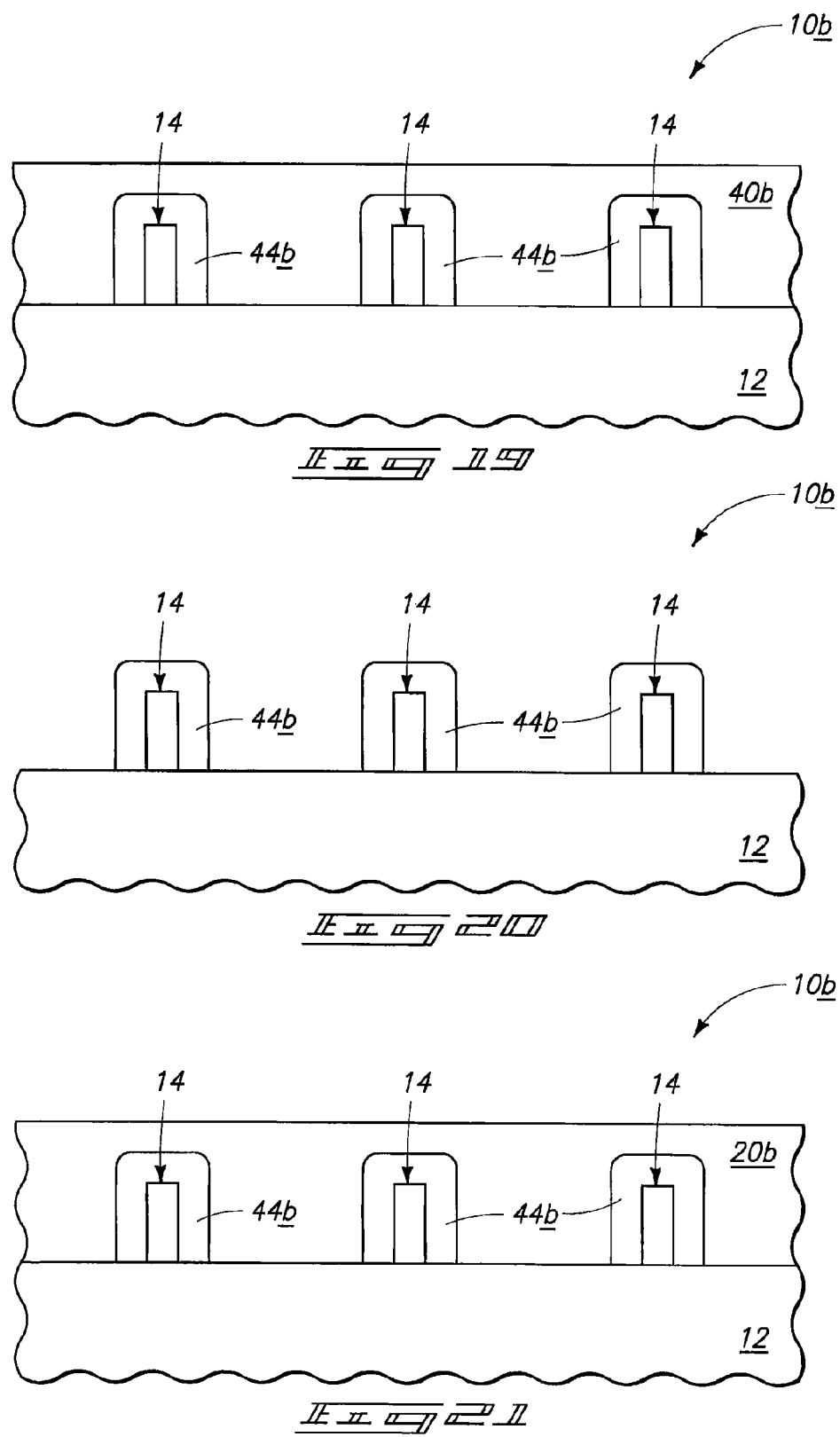

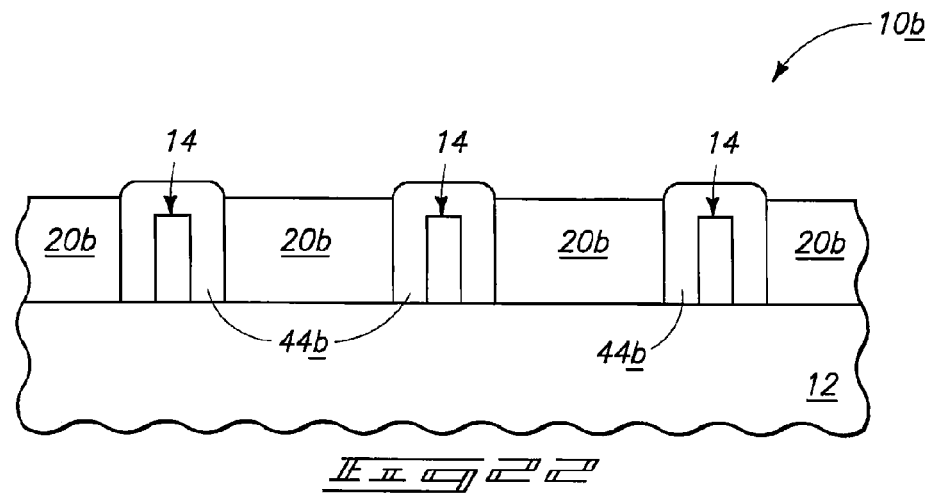
_FIG 22_
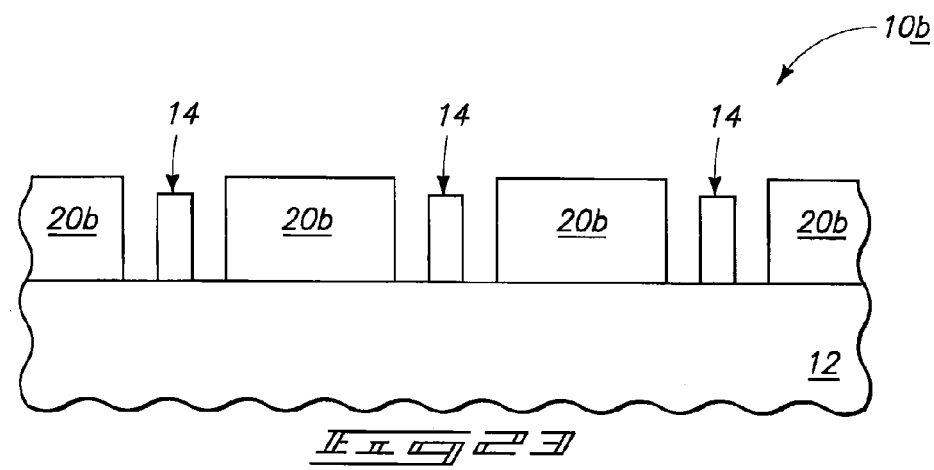
_FIG 23_
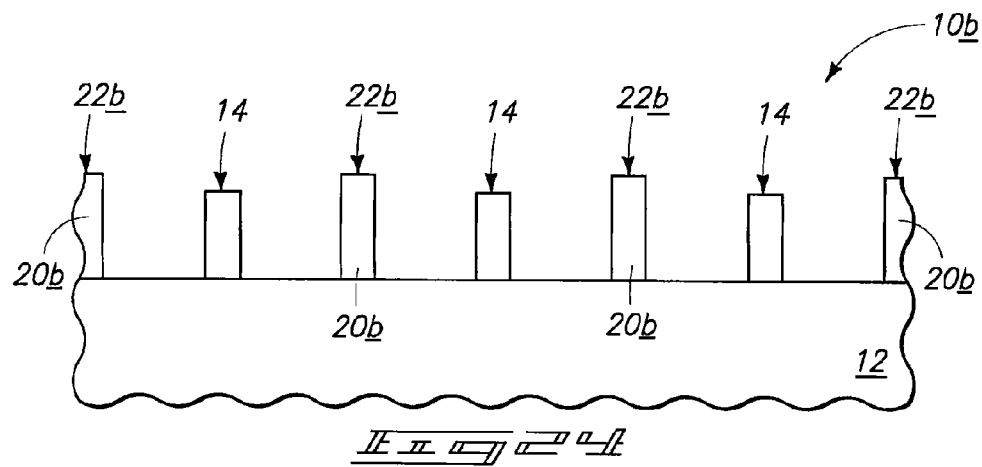
_FIG 24_

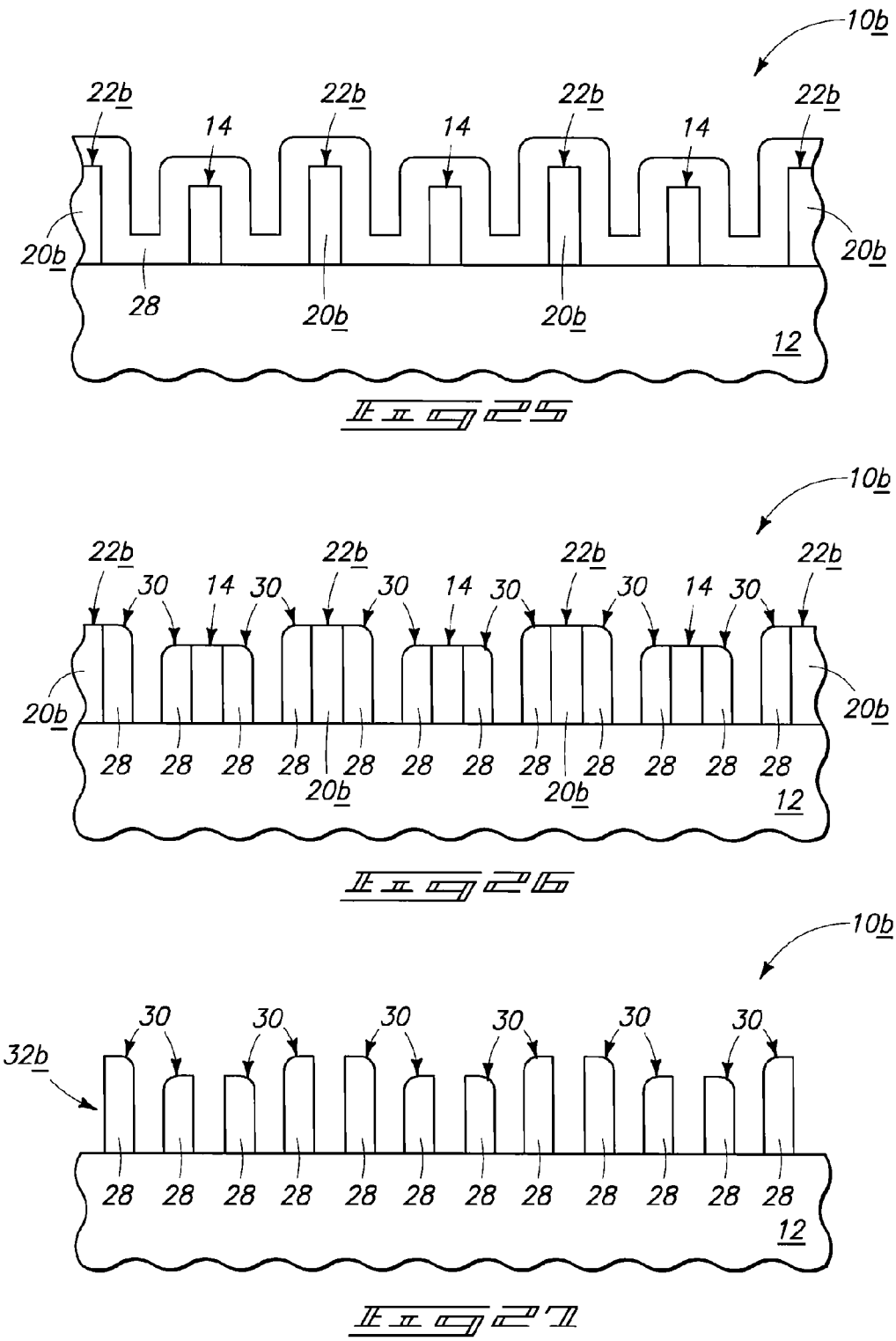

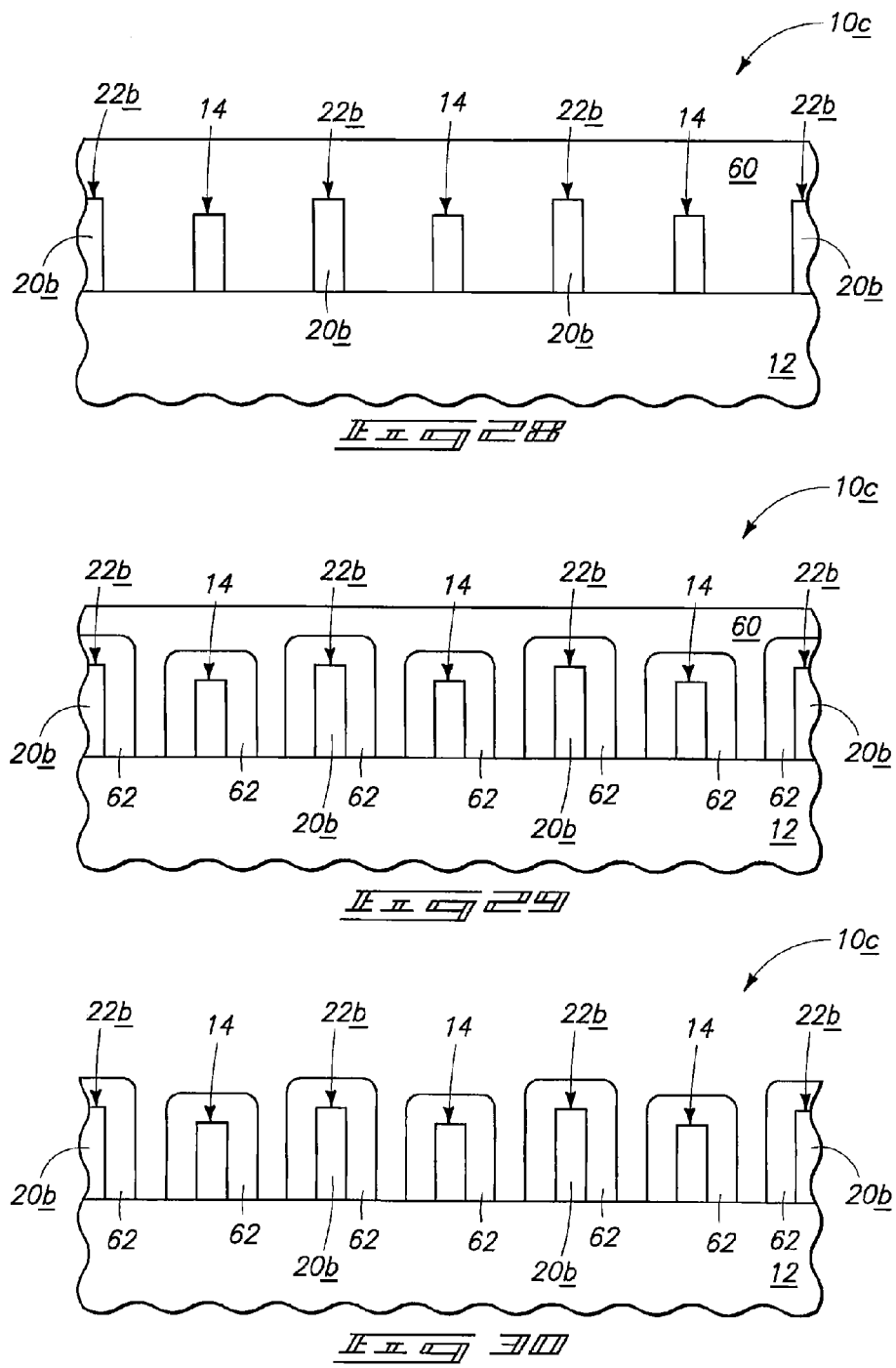

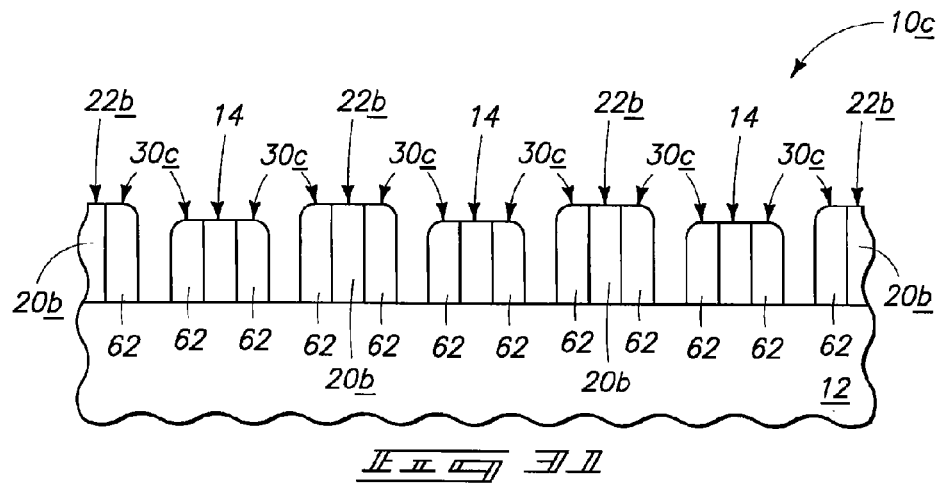

METHODS OF FABRICATING SUBSTRATES

TECHNICAL FIELD

Embodiments disclosed herein pertain to methods of fabricating substrate, for example as may be used in the fabrication of integrated circuitry.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized.

The continual reduction in feature sizes places ever greater demands on the techniques used to form the features. For example, photolithography is commonly used to form patterned features, such as conductive lines. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing spacer-forming layers to have a lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times and also of fractional values other than integers. Thus, conventionally, "multiplication" of pitch by a certain factor actually involves reducing the pitch by that factor.

BRIEF DESCRIPTION OF THE DRAWINGS

FIG. 4 is a view of the FIG. 3 substrate at a processing step subsequent to that shown by FIG. 3.

FIG. 5 is a view of the FIG. 4 substrate at a processing step subsequent to that shown by FIG. 4.

FIG. 6 is a view of the FIG. 5 substrate at a processing step subsequent to that shown by FIG. 5.

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 9 is a view of the FIG. 8 substrate at a processing step subsequent to that shown by FIG. 8.

FIG. 10 is a view of the FIG. 9 substrate at a processing step subsequent to that shown by FIG. 9.

FIG. 11 is a view of the FIG. 10 substrate at a processing step subsequent to that shown by FIG. 10.

FIG. 12 is diagrammatic sectional view of another substrate in process in accordance with an embodiment of the invention.

FIG. 16 is a view of the FIG. 15 substrate at a processing step subsequent to that shown by FIG. 15.

FIG. 17 is a view of the FIG. 16 substrate at a processing step subsequent to that shown by FIG. 16.

FIG. 18 is a diagrammatic sectional view of another substrate in process in accordance with an embodiment of the invention.

FIG. 19 is a view of the FIG. 18 substrate at a processing step subsequent to that shown by FIG. 18.

FIG. 20 is a view of the FIG. 19 substrate at a processing step subsequent to that shown by FIG. 19.

FIG. 21 is a view of the FIG. 20 substrate at a processing step subsequent to that shown by FIG. 20.

FIG. 22 is a view of the FIG. 21 substrate at a processing step subsequent to that shown by FIG. 21.

FIG. 23 is a view of the FIG. 22 substrate at a processing step subsequent to that shown by FIG. 22.

FIG. 24 is a view of the FIG. 23 substrate at a processing step subsequent to that shown by FIG. 23.

FIG. 25 is a view of the FIG. 24 substrate at a processing step subsequent to that shown by FIG. 24.

FIG. 26 is a view of the FIG. 25 substrate at a processing step subsequent to that shown by FIG. 25.

FIG. 27 is a view of the FIG. 26 substrate at a processing step subsequent to that shown by FIG. 26.

FIG. 28 is a diagrammatic sectional view of another substrate in process in accordance with an embodiment of the invention.

FIG. 29 is a view of the FIG. 28 substrate at a processing step subsequent to that shown by FIG. 28.

FIG. 30 is a view of the FIG. 29 substrate at a processing step subsequent to that shown by FIG. 29.

FIG. 31 is a view of the FIG. 30 substrate at a processing step subsequent to that shown by FIG. 30.

FIG. 32 is a view of the FIG. 31 substrate at a processing step subsequent to that shown by FIG. 31.

DETAILED DESCRIPTION OF EXAMPLE EMBODIMENTS

Figure 1:
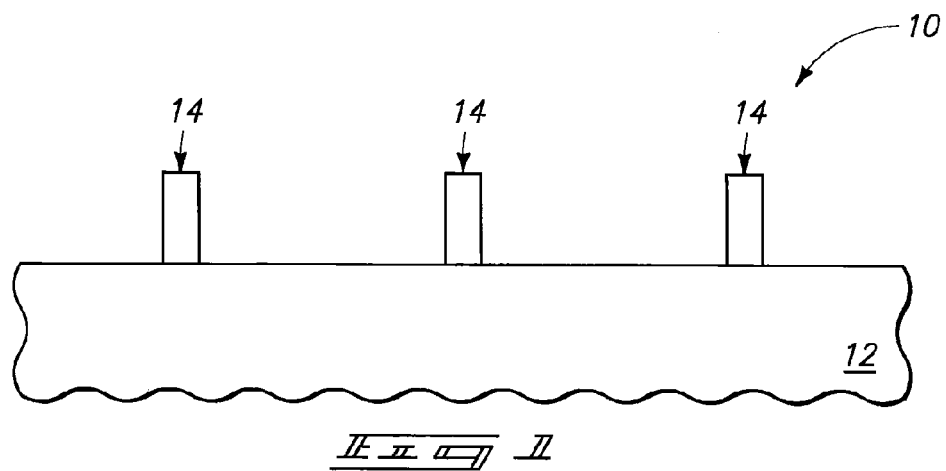
FIG. 1 is a diagrammatic sectional view of a substrate in process in accordance with an embodiment of the invention.

Some embodiments of methods of fabricating a substrate in accordance with the invention, for example in forming integrated circuitry, are described initially with reference to FIGS. 1-11. Referring to FIG. 1, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 is depicted as comprising material 12 which will ultimately be processed through a mask pattern formed thereover. Material 12 may be homogenous or non-homogenous, for example comprising multiple different composition regions and/or layers. Spaced first features 14 have been formed over substrate 12. Any suitable material is contemplated, and whether homogenous or non-homogenous. In the context of this document, "spaced" refers to the lateral direction as opposed to vertically or otherwise. Spaced first features 14 may be patterned/formed by any existing or yet-to-be-developed manner, with photolithographic patterning using photoresist (whether positive, negative or dual-tone resist resulting from single or multi-pattern lithography) being an example. Further, spaced first features 14 may be formed by any technique described below. In one example, spaced first features 14 may be in the form of elongated lines, for example running parallel one another over at least some portion of the substrate as would be viewed in a top-down view (not shown).

Figure 2:
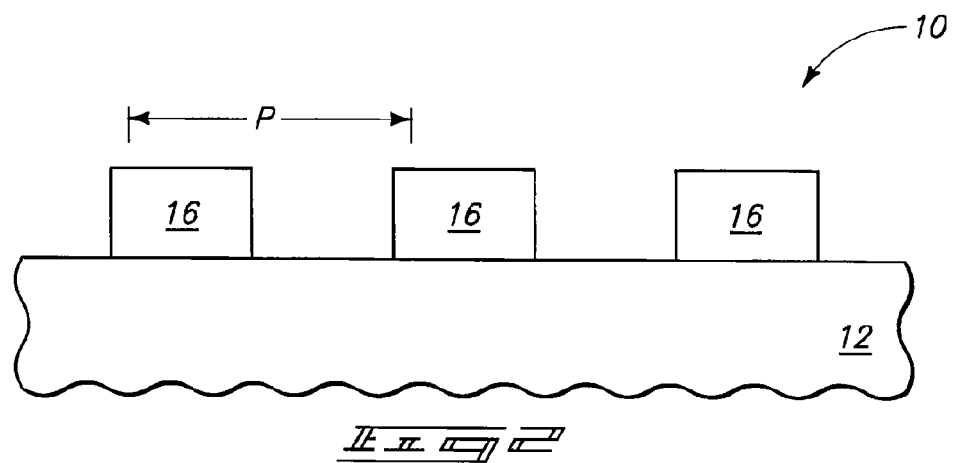
FIG. 2 is a view of the FIG. 1 substrate at a processing step prior to that of FIG. 1.

Further in one embodiment, spaced first features 14 may result from lateral etching/trimming of wider features. For example, FIG. 2 depicts substrate 10 at a processing step prior to that of FIG. 1. Such is shown as comprising spaced mask features 16, for example comprising, consisting essentially of, or consisting of photoresist, having been fabricated over substrate 12 in a repeating pattern of a pitch "P". Pitch P may be equal to, greater than, or less than the minimum photolithographic resolution with which substrate 10 is fabricated. Regardless, spaced mask features 16 of FIG. 2 have been laterally trimmed to reduce their respective widths to produce the example construction of FIG. 1 which comprises spaced first features 14. Such may be conducted by an isotropic etch which removes material approximately equally from the sides and tops of spaced mask features 16. Alternately, chemistry and conditions may be used which tend to etch greater material from the lateral sides of spaced mask features 16 than from the respective tops. Alternately, chemistries and conditions may be used which tend to etch greater material from the tops of spaced mask features 16 than from the lateral sides.

For example, the construction depicted by FIG. 1 can be derived by plasma etching the substrate of FIG. 2 within an inductively coupled reactor. Example etching parameters which will achieve essentially isotropic etching where material of spaced mask features is photoresist and/or other organic-comprising material are pressure from about 2 mTorr to about 50 mTorr, substrate temperature from about 0° C. to about 110° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where material of spaced mask features 16 comprises photoresist, such will isotropically etch mask features 16 at a rate from about 0.2 nanometer per second to about 3 nanometers per second. While such an example etch is essentially isotropic, greater lateral etching of the spaced mask features will occur as two sides are laterally exposed as compared to only a single upper surface thereof.

If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm.

It may be desired that the stated etching provide greater removal from the top of the spaced mask features than from the sides, for example to either achieve equal elevation and width reduction or more elevation than width reduction. The example parameters for achieving greater etch rate in the vertical direction as opposed to the lateral direction include pressure from about 2 mTorr to about 20 mTorr, temperature from about 0° C. to about 100° C., source power from about 150 watts to about 300 watts, bias voltage at greater than or equal to about 200 volts, $Cl_2$ and/or HBr flow from about 20 sccm to about 100 sccm, and $O_2$ flow from about 10 sccm to about 20 sccm.

The example FIGS. 1 and 2 embodiments depict the respective features as having equal shapes and widths relative one another in the depicted cross section, as well as equal spacing therebetween. Such is not, however, required in this or other embodiments.

Outermost surfaces of spaced first features 14 may be treated, for example to provide resistance to etching using solvents or other etching chemistries which may be used to etch other materials on the substrate subsequently. Any such treating, if conducted, may depend on composition of first features 14 and may modify composition of spaced first features 14 only proximate their outermost surfaces, or internally thereof including the possibility of modifying composition of the entirety of spaced first features 14. For example, first features 14 might be annealed to harden outermost surfaces thereof, and/or promote cross-linking when formed of polymer material.

As an additional example, spaced first features 14 may be exposed to a fluorine-containing plasma effective to form a hydrogen and fluorine-containing organic polymer coating (not shown) about outermost surfaces thereof, for example where features 14 comprise photoresist and/or other organic material. Such a coating may be deposited as a layer over features 14, and/or result from transformation of the outer material of features 14 to form a coating independent of adding thickness to features 14. Regardless, the fluorine-containing plasma might be generated either one or both of within a chamber within which substrate 10 is received and remote of a chamber within which substrate 10 is received. If plasma generation occurs within a chamber in which the substrate is received, such might by way of example include an inductively coupled plasma generating reactor or a capacitively coupled plasma generating reactor. Other existing or yet-to-be-developed plasma systems may also be used. Example gases which may be used for forming the fluorine-containing plasma include at least one of a fluorocarbon (i.e., $CF_4$, $C_4F_6$, $C_4F_8$), a hydrofluorocarbon (i.e., $CH_2F_2$, $CHF_3$), and $NF_3$, including any mixtures thereof. Inert gases may also be added. In an inductively coupled reactor, example parameters include pressure from about 1 mTorr to about 20 mTorr, substrate temperature from about 0° C. to about 110° C., source power from about 150 watts to about 800 watts, and bias voltage less than or equal to about 50 volts. An example total flow rate for the fluorine-containing gas into the reactor is from about 20 sccm to about 150 sccm. In a more specific example, $CF_4$ and $CH_2F_2$ are both flowed into the reactor, for example $CF_4$ from about 20 sccm to about 120 sccm and $CH_2F_2$ from about 5 sccm to about 25 sccm. $O_2$ may or may not also be used with the gases to form the fluorine-containing plasma. An example $O_2$ flow rate is from 0 sccm to about 10 sccm.

Exposure to the fluorine-containing plasma may or may not change the lateral dimensions of spaced first features 14 in the depicted cross section and may or may not change the spacing between adjacent of first features 14 in the depicted cross section. By way of example only in the above example process, pressure at the higher end of the stated 1 mTorr to 20 mTorr range in combination with flowing $CH_2F_2$ at the higher end of the stated 5 sccm to 25 sccm range would tend to increase width of spaced first features 14 and reduce width of spaces therebetween.

Figure 3:
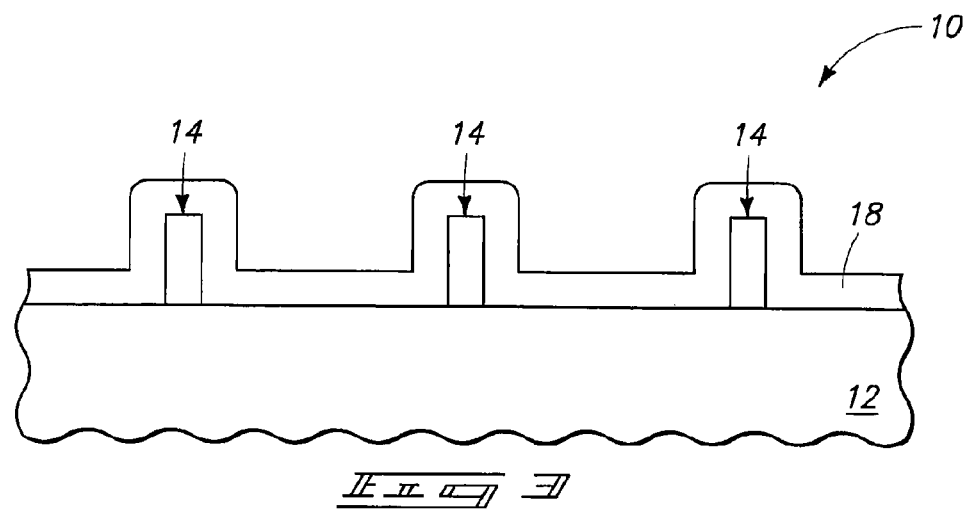
FIG. 3 is a view of the FIG. 1 substrate at a processing step subsequent to that shown by FIG. 1.

Referring to FIG. 3, a first material 18 has been deposited over spaced first features 14. Such is of some different composition from that of spaced first features 14, and may be conductive, semiconductive, or insulative, including any combination thereof. Examples include silicon dioxide, silicon nitride, organic antireflective coatings, inorganic antireflective coatings, polysilicon, titanium or titanium nitride, including any combination thereof.

Referring to FIG. 4, a second material 20 has been deposited over first material 18, and is of some different composition from that of first material 18. Such may be of the same or some different composition from that of spaced first features 14. Such may be formed to have a planar or non-planar outermost surface, with a planar outermost surface 21 being shown. Such may, for example, result from the inherent deposition of material 20 in a liquid-fill manner, or from deposition of one or more conformal layers followed by some sort of polish-back or etch-back thereof. Example second materials 20 include photoresist and other polymers, for example, polystyrene, polymethylmethacrylate and polysiloxane. Second material 20 may or may not be homogenous.

Referring to FIG. 5, only a portion of second material 20 has been removed to expose first material 18 and form regions of spaced second material 20 received over first material 18. Any suitable etching technique and conditions can be selected by the artisan. Some of first material 18 may or may not be etched during the processing to produce the construction of FIG. 5.

Referring to FIG. 6, first material 18 has been etched from between spaced second material 20 and spaced second features 22 have been formed which comprise spaced second material 20 received over first material 18. Second features 22 are spaced from first features 14. Any suitable substantially anisotropic etching chemistry and conditions can be selected by the artisan for producing the FIG. 6 construction. In one embodiment, second material 20 has a planar outermost surface prior to any removing of second material 20. In one embodiment, no etch mask other than first material 18 is received over any of spaced first features 14 during such etching of first material 18. In one embodiment, no etch mask is received anywhere over the substrate during such etching of first material 18.

Referring to FIG. 7, width of spaced second features 22 from FIG. 6 has been laterally trimmed. Example techniques for doing so include etching of second material 20 and first material 18. Some lateral width trimming of spaced first features 14 may also occur during the laterally trimming of width of spaced second features 22. Alternately and as shown in the processing going from FIG. 6 to FIG. 7, no lateral width trimming of spaced first features 14 has occurred during the laterally trimming of width of spaced second features 22. For example, treating at least outermost surfaces of first features 14 as described above, and depending on composition of second material 20 and first material 18, may be conducted to provide some or near infinite etch resistance to spaced first features 14 in producing the construction of FIG. 7.

Regardless, the example lateral trimming of FIG. 7 may or may not result in equal width of each spaced second feature 22, and/or equal width of second material 20 and first material 18 of each spaced second feature 22. Also, all of spaced first features 14 are shown as being of the same respective starting dimensions relative one another, and second features 22 are also shown to be of the same respective starting dimensions relative one another, but such is not required. Further and regardless, the act of lateral trimming may be simultaneously conducted in degree of the first and second materials relative to one another, and/or multiple different etching chemistries may be used depending upon the compositions of second material 20 and first material 18. For example where composition of materials 20 and 18 are both organic, example processing which may be used to laterally trim width of second material 20 and first material 18 of spaced second features 22 substantially equally includes any of that described above in producing the construction of FIG. 1 from that of FIG. 2. Further and regardless, some reduction or no reduction of the respective thicknesses of spaced first features 14 and spaced second features 22 may occur during the act of lateral trimming.

In one embodiment, a method of fabricating a substrate includes forming spaced first features and spaced second features over a substrate, where the first and second features alternate with each of the other, and which are spaced relative one another. Width of the spaced second features is laterally trimmed to a greater degree than any lateral trimming of width of the spaced first features while/during the act of laterally trimming width of the spaced second features.

Spacers are formed on sidewalls of the spaced first features and on sidewalls of the spaced second features, and which are of some different composition from that of the spaced first features and from that of the spaced second features. Any existing or yet-to-be developed technique may be used, with one example being shown in FIGS. 8 and 9. Referring to FIG. 8, a spacer-forming layer 28 has been deposited over spaced first features 14 and spaced second features 22 of the FIG. 7 construction. Any suitable material is contemplated wherein at least some, if not all, of spaced first features 14 and spaced second features 22 may be selectively etchable relative thereto.

Referring to FIG. 9, spacer-forming layer 28 has been anisotropically etched to form spacers 30 and outwardly expose spaced first features 14 and spaced second features 22. In one embodiment, such may be conducted in a maskless manner wherein no mask is received over the substrate during etch of spacer-forming layer 28 to produce the FIG. 9 construction.

Referring to FIG. 10, first features 14 (not shown) and second features 22 (not shown) have been removed from the substrate. An example technique includes etching, with the artisan being capable of choosing any existing or yet-to-be developed etching chemistries and conditions. FIG. 10 depicts one example embodiment where a mask pattern 32 which comprises spacers 30 has been formed over substrate 12. Such also depicts an example embodiment wherein spacers 30 have at least two different thickness, although common thickness or more variability in thickness may result. In one embodiment, spacers 30 of mask pattern 32 comprise alternating first and second pairs 31, 33, respectively, of immediately adjacent spacers. Spacers 30 of first pair 31 have a first common thickness, and spacers 30 of second pair 33 have a second common thickness. The first and second thicknesses are different.

The above processing may be conducted, for example, to result in a pitch multiplication which may or may not be sub-lithographic. Regardless, the FIGS. 1-10 embodiments depict mask pattern 32 (FIG. 10) having been formed to have a pitch which is one-fourth (an integer factor of 4) that of pitch "P" of spaced mask features 16 in FIG. 2. Any degree of pitch reduction (including non-integer fractional reduction) in FIGS. 1-10, or otherwise, will of course be in large part determined on the degree of lateral trimming that may occur of spaced features (for example in forming the FIGS. 2, 6 and 7 constructions) in combination with thickness of the deposited layers to produce the features and the spaces between the features. For example, the deposition thickness of first material 18 in FIG. 3 in combination with the etching technique to produce the construction of FIG. 6 impacts width of spaced second features 22 in FIG. 6. Further and regardless, some or all of first features 16 and/or second features 22 may be further laterally trimmed after forming the FIG. 7 construction. Further, spacers 30 of FIG. 10 may be laterally trimmed by the act of removing first features 14 and second features 22, and/or subsequently thereafter by a dedicated lateral trimming step.

The mask pattern comprising the spacers is used to process the substrate received elevationally there-below through such mask pattern. Such processing may constitute any existing or yet-to-be developed technique, with etching and/or ion implanting being specific examples. FIG. 11 depicts one example of such processing wherein mask pattern 32 has been used as an etch mask while etching into material 12 of substrate 10.

Additional embodiments are next described with reference to FIGS. 12-17. FIG. 12 depicts an alternate embodiment substrate fragment 10a corresponding in processing sequence to that of FIG. 8. Like numerals from the first described embodiments have been utilized where appropriate, with construction differences being indicated with the suffix "a" or with different numerals. While the suffix "a" indicates different construction, example material for such constructions is the same as used in the above embodiments for the same numerals without the suffix "a". An alterable material 40 has been formed over first features 14 and second features 22 of the FIG. 7 construction. Alterable material 40 interacts selectively or uniformly with certain materials with which it forms an interface. Alterable material 40 may be cast onto a pre-patterned surface (for example as shown) and may be conformal or non-conformal. Casting via spin-casting, dip-casting, drop-casting, or similar, are examples. The alterable material will be altered by material from the spaced second features to form altered material on sidewalls of the spaced second features. The altered material may form spontaneously upon deposition of the alterable material, or be subsequently activated, for example via thermal, photonic, electronic, ionic (including acid-based chemistry) treatments, by way of examples only. Accordingly, the altering may occur during deposition and/or after deposition. In one embodiment, no altering occurs until after completion of the deposition of the alterable material. Further, the altering may be self-limiting in the case of a limiting reagent or equilibrium conditions, or kinetically arrested if reactants are in excess. Alterable material 40 may have a planar outermost surface or a non-planar outermost surface, with an example planar outermost surface 42 being depicted in FIG. 12. Alterable material may or may not be homogenous.

Material 40 may be similar to a class of materials available from Clariant International, Ltd. as so-called "AZ R" materials, such as the materials designated as AZ R200™, AZ R500™ and AZ R600™. The "AZ R" materials contain organic compositions which cross-link upon exposure to acid released from chemically-amplified resist. Accordingly for example, such materials constitute an example alterable material where material of spaced second features 20 comprises chemically-amplified resist. More specifically, an "AZ R" material may be coated across photoresist, and subsequently the resist may be baked at a temperature of from about 100° C. to about 120° C. to diffuse acid from the resist into the alterable material to form chemical cross-links within regions of the alterable material proximate the resist. Portions of the material adjacent the resist are thus selectively hardened relative to other portions of material that are not sufficiently proximate the resist. The material may then be exposed to conditions which selectively remove the non-hardened portions relative to the hardened portions. Such removal may be accomplished utilizing, for example, 10% isopropyl alcohol in deionized water, or a solution marketed as "SOLUTION C™" by Clariant International, Ltd. Processes utilizing the "AZ R" materials are sometimes considered examples of RELACS (Resolution Enhancement Lithography Assisted by Chemical Shrink) processes.

A challenge with the "AZ R" materials is that they can be similar enough in composition to photoresist that it may be difficult to selectively remove photoresist relative to hardened "AZ R" materials. In one embodiment, alterable material 40 may be similar to the "AZ R" materials in that it may comprise a similar or identical organic composition which is altered (for instance, forms cross-links) upon exposure to one or more substances (for instance, acid) released from materials 14, 20, 18 over which material 40 lies when the substrate is baked. However, unlike "AZ R" materials, material 40 may also contain one or more components dispersed in the organic composition which are provided to chemically change material 40 relative to material of features 14 and 22 (for example, photoresist and/or other organic material in embodiments where material of features 14 and 22 may be selectively removed relative to material 40). Components which may be dispersed in an organic composition of a material 40 may include one or more of titanium, carbon, fluorine, bromine, silicon and germanium. Any carbon dispersed in the organic composition may be part of a carbide compound so it is chemically different from bulk carbon of the organic composition. Any fluorine and/or bromine may be, for example, comprised of hydrofluoric acid and hydrobromic acid. In some embodiments, the components dispersed in an organic composition of a material 40 include one or more inorganic components, such as, for example, silicon, germanium, metals (for instance, titanium, tungsten, platinum, etc.) and/or metal-containing compounds (for instance, metal nitride, metal silicide, etc.). The component of material 40 that is similar to "AZ R" materials may be referred to as an "AZ R"-type composition. Accordingly, in some embodiments, alterable material 40 may be considered to have one or more inorganic components dispersed in an organic "AZ R"-type composition. However, alterable material 40 may comprise other than organic and other than "AZ R"-type compositions, for example as explained below.

Figure 13:
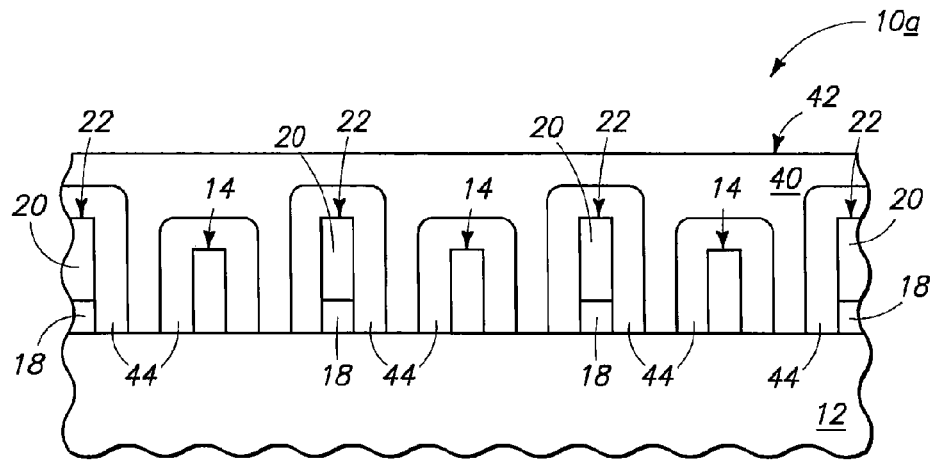
FIG. 13 is a view of the FIG. 12 substrate at a processing step subsequent to that shown by FIG. 12.

Referring to FIG. 13, substrate 10a has been subjected to conditions which cause inter-diffusion of materials 20 and 40 and inter-diffusion of materials 14 and 40. Some substance of materials 20 and 14 alters material 40 to form altered material 44 proximate spaced first features 14 and spaced second features 22. Accordingly, the alterable material is capable of being altered with material from the first and second features to form altered material on sidewalls of the first and second features, for example as shown in FIG. 13. In one embodiment, the altering alters a portion of the alterable material 40 adjacent each of spaced first features 14 and spaced second features 22 to form altered material 44 while leaving portions of the alterable material distal from the spaced first and second features unaltered. FIG. 13 also depicts an embodiment wherein altered material 44 has been formed elevationally over first features 14 and over second features 22. Altered material 44 may or may not be homogenous.

In some embodiments, material of first features 14 and second features 22 comprises chemically-amplified photoresist, and the substance from such photoresist which imparts the altering to material 44 is acid. The acid may be caused to be released from photoresist by baking semiconductor substrate 10a at a temperature of at least about 100° C. The acid forms cross-links with "AZ R"-type composition of material 40. The amount of cross-linking, and the distance that the cross-linking spreads from features 14 and 22 may be adjusted by modifying one or both of bake time and bake temperature.

As an additional example where materials 14, 18 and 20 comprise silicon, an example alterable material 40 is a refractory metal, such as titanium, to result in a reaction ultimately to form the altered material to comprise a metal silicide. Such by way of example only is shown and described in U.S. Patent Application Publication No. US2007/0049030. Additional alterable materials depending at least in part upon the composition of the spaced second features are also of course contemplated, and whether existing or yet-to-be developed.

Figure 14:
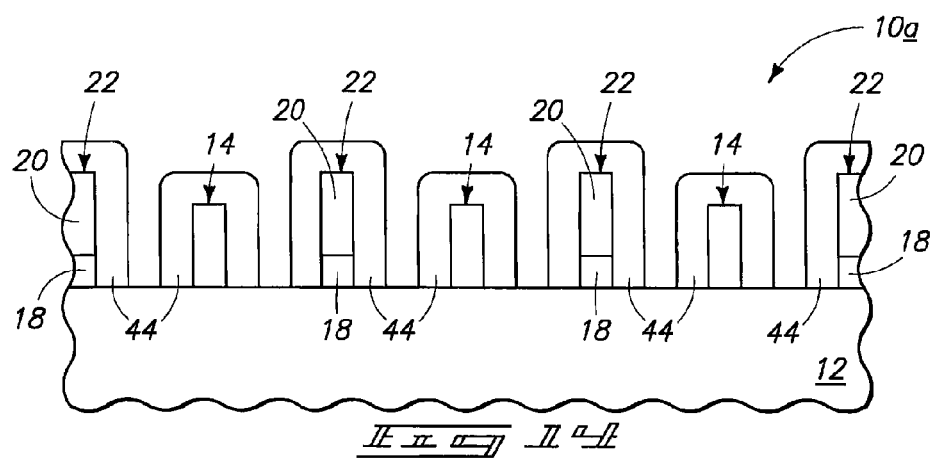
FIG. 14 is a view of the FIG. 13 substrate at a processing step subsequent to that shown by FIG. 13.

Referring to FIG. 14, and in one embodiment, un-reacted distal portions of material 40 (not shown) which were not altered to form material 44 have been removed, for example by etching, selectively relative to altered material 44. Suitable chemistries and conditions may be selected by the artisan depending upon composition of materials 40, 44 and 12. For example with respect to the "AZ R"-type compositions referred to above, such removal may be accomplished utilizing isopropyl alcohol and/or SOLUTION C™ as discussed above. Where material 40 may comprise additional components dispersed in an "AZ R"-type composition, such components may simply rinse away as the non-altered regions of material 40 are removed. Alternately, such additional components may be removed with solvents which remove the additional components. For instance, if silicon dioxide is utilized as a component of material 40, hydrofluoric acid may be utilized during removal of the non-altered regions of material 40 to ensure that the silicon dioxide of the non-altered regions is removed in addition to the "AZ R"-type composition of the non-altered regions.

Figure 15:
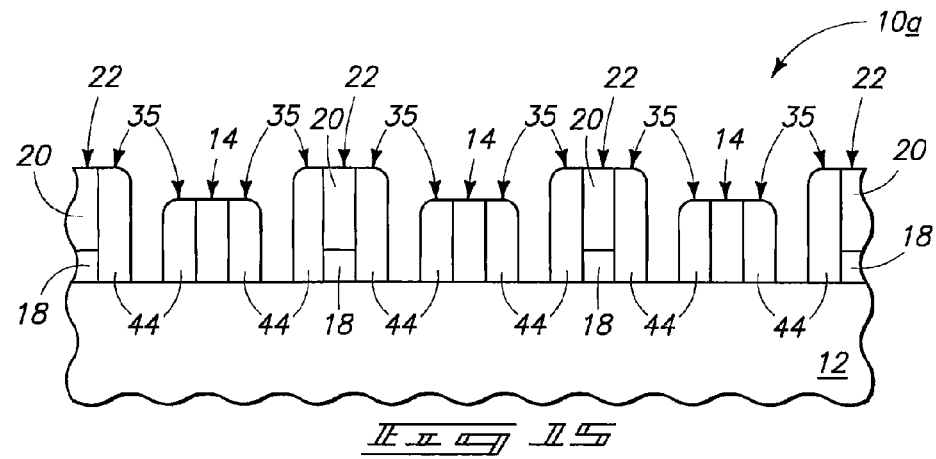
FIG. 15 is a view of the FIG. 14 substrate at a processing step subsequent to that shown by FIG. 14.

Referring to FIG. 15, altered material 44 has been anisotropically etched to form spacers 35.

Referring to FIG. 16, first features 16 and second features 22 have been removed from the substrate, forming a mask pattern 37 comprising altered material 44.

Referring to FIG. 17, substrate 10a has been processed through mask pattern 37. The example processing depicted in FIG. 17 is that of ion implantation, forming implanting regions 46.

Additional embodiments of methods of fabricating a substrate are next described with reference to FIGS. 18-27 with respect to a substrate fragment 10b. Like numerals with respect to the above-described embodiments are utilized where appropriate, with differences in construction being indicated with the suffix "b" or with different numerals. While the suffix "b" indicates different construction, example material for such constructions may be the same as used in the above embodiments for the same numerals without the suffix "b". FIG. 18 depicts alternate processing to that of FIG. 3, and wherein an alterable material 40b has been formed over spaced first features 14.

Referring to FIG. 19, alterable material 40b has been altered with material from spaced first features 14 to form altered material 44b on sidewalls of spaced first features 14. Processing may be as described above, or otherwise, with respect to alterable material 40 and altered material 44.

Referring to FIG. 20, those portions of alterable material 40b (not shown) which were not altered have been removed from substrate 10b.

Referring to FIG. 21, a first material 20b has been deposited over altered material 44b, and is of some different composition from that of altered material 44b.

Referring to FIG. 22, only a portion of first material 20b has been removed to expose altered material 44b and form spaced first material 20b.

Referring to FIG. 23, altered material 44b (not shown) has been etched from between spaced first material 20b and spaced first features 14.

Referring to FIG. 24, width of spaced first material 20b has been laterally trimmed, and spaced second features 22b have been formed.

In one embodiment, anisotropically etched spacers of some different composition from that of the spaced first features and from that of the spaced first material are formed on sidewalls of the spaced first features and on sidewalls of the spaced first material. For example, FIG. 25 depicts deposition of spacer-forming layer 28, and FIG. 26 depicts etching thereof to form spacers 30.

Referring to FIG. 27, spaced first features 14 (not shown) and spaced first material 20b (not shown) have been removed from the substrate, thereby forming a mask pattern 32b comprising anisotropically etched spacers 30. Substrate 12 would be processed through mask pattern 32b, for example using any technique as described above.

Alternate embodiments to that depicted by FIGS. 20-27 are also contemplated. For example, material 40b of FIG. 19 might be processed such that only a portion thereof is removed to expose second altered material 44b and form spaced alterable material as opposed to deposition of material 20b and removing a portion thereof. For example, material 40b of FIG. 19 could be removed to directly produce the construction of FIG. 22 wherein material 20b is substituted by material 40b. After forming such spaced alterable material, altered material 44b would be etched from between the spaced alterable material and third features would be formed which comprise the spaced alterable material, with the third features being spaced from the second features. For example, the construction of FIG. 23 could be formed wherein material 20b is substituted by spaced alterable material 4b after material 44 of FIG. 21 has been removed. Processing could then proceed as shown and described with reference to FIGS. 24-27.

Additional embodiments are next described with reference to FIGS. 28-32. FIG. 28 depicts alternate processing to that of FIG. 25 with respect to a substrate fragment 10c. Like numerals from the above-described embodiments have been utilized where appropriate, with construction differences being indicated with the suffix "c" or with different numerals. While the suffix "c" indicates different construction, example material for such constructions is the same as used in the above embodiments for the same numerals without the suffix "c". Prior to the processing of FIG. 28, the processing of FIGS. 18-24 has occurred wherein material 40b of FIG. 18 may be considered as a first alterable material which was formed over spaced first features 14, and which was altered with material from spaced first features 14 to form a first altered material 44b on sidewalls of spaced first features 14. First material 20b was deposited over first altered material 44b. Only a portion of first material 20b was subsequently removed to expose first altered material 44b and form spaced material 20b. First altered material was etched from between spaced first material 20b and spaced first features 14. Width of spaced first material 20b was laterally trimmed, and spaced second features 22b have been formed. Alternately, unaltered of the alterable material may be used in place of the first material, as described above.

Referring to FIG. 28, a second alterable material 60 has been deposited over spaced first features 14 and over the spaced first material 20b. Composition and attributes of second alterable material 60 are the same as that described above for alterable material 40 and depending at least in part on composition of spaced first features 14 and spaced second features 22b.

Referring to FIG. 29, second alterable material 60 has been altered with material from spaced first features 14 and with material from spaced first material/second spaced features 22c to form second altered material 62 on sidewalls of spaced first features 14 and on sidewalls of spaced first material/second spaced features 22c.

Referring to FIG. 30, unaltered second alterable material 60 (not shown) has been removed from the substrate selectively relative to second altered material 62.

Referring to FIG. 31, second altered material 62 has been anisotropically etched to form spacers 30c.

Referring to FIG. 32, first features 14 (not shown) and first material/spaced second features 22b (not shown) have been removed from the substrate, thereby forming a mask pattern 49 comprising second altered material 62. Substrate 12 would be processed through mask pattern 49, for example using any technique as described above.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of fabricating a substrate, comprising:
forming spaced first features and spaced second features over a substrate, the first and second features alternating with one another and being spaced relative one another;
laterally trimming width of the spaced second features to a greater degree than any lateral trimming of width of the spaced first features while laterally trimming width of the spaced second features;
after the laterally trimming, forming spacers on sidewalls of the spaced first features and on sidewalls of the spaced second features, the spacers being of some different composition from that of the spaced first features and from that of the spaced second features;
after forming the spacers, removing the spaced first features and the spaced second features from the substrate; and
after the removing of the spaced first and second features from the substrate, processing the substrate through a mask pattern comprising the spacers.

2. The method of claim 1 wherein the forming of the spaced second features comprises etching material from which the spaced second feature are formed while no etch mask is received anywhere over the substrate.

3. The method of claim 1 wherein the spaced second features are formed to comprise second material received over first material, the first and second materials being of some different composition.

4. The method of claim 1 wherein forming the spacers comprises deposition of a spacer-forming layer followed by maskless anisotropic etching thereof.

5. The method of claim 1 wherein forming the spacers comprises depositing an alterable material over the spaced first features and the spaced second features and altering the alterable material with material from the spaced first features and with material from the spaced second features to form altered material which comprises the spacers.

6. The method of claim 1 wherein no lateral width trimming of the spaced first features occurs during the laterally trimming of width of the spaced second features.

7. The method of claim 1 wherein the laterally trimming of width of the spaced second features comprises etching; and
further comprising treating outermost surfaces of the spaced first features to provide resistance of the spaced first features to said etching.

8. The method of claim 7 wherein no lateral width trimming of the spaced first features occurs during said etching to laterally trim width of the spaced second features.

9. A method of fabricating a substrate, comprising:
forming spaced first features over a substrate;
depositing a first material over the spaced first features which is of some different composition from that of the spaced first features;
depositing a second material over the first material, the second material being of some different composition from that of the first material;
removing only a portion of the second material to expose the first material and form spaced second material received over the first material;
after forming the spaced second material, etching the first material from between the spaced second material and forming spaced second features which comprise spaced second material received over first material, the second features being spaced from the first features;

after the etching of the first material, laterally trimming width of the spaced second features;

after the laterally trimming, forming spacers on sidewalls of the spaced first features and on sidewalls of the spaced second features, the spacers being of some different composition from that of the spaced first features and from that of the spaced second features;

after forming the spacers, removing the first features and the second features from the substrate; and after the removing of the first features and the second features from the substrate, processing the substrate through a mask pattern comprising the spacers.

10. The method of claim 9 wherein the second material has a planar outermost surface prior to any removing of the second material.

11. The method of claim 9 wherein forming the spacers comprises deposition of a spacer-forming layer followed by maskless anisotropic etching thereof.

12. The method of claim 9 wherein forming the spacers comprises depositing an alterable material over the spaced first features and the spaced second features and altering the alterable material with material from the spaced first features and with material from the spaced second features to form altered material which comprises the spacers.

13. The method of claim 9 wherein the spacers of the mask pattern have at least two different thicknesses.

14. The method of claim 9 wherein the spacers of the mask pattern comprise alternating first and second pairs of immediately adjacent spacers, the spacers of the first pair having a first common thickness and the spacers of the second pair having a second common thickness, the first and second thicknesses being different.

15. A method of fabricating a substrate, comprising:
forming spaced first features over a substrate;
depositing a first material over the spaced first features which is of some different composition from that of the spaced first features;
depositing a second material over the first material, the second material being of some different composition from that of the first material;
removing only a portion of the second material to expose the first material and form spaced second material received over the first material;
after forming the spaced second material, etching the first material from between the spaced second material and forming spaced second features which comprise spaced second material received over first material, the second features being spaced from the first features;
after the etching of the first material, laterally trimming width of the spaced second features;
after the laterally trimming, depositing an alterable material over the spaced first features and the spaced second features and altering the alterable material with material from the spaced first features and with material from the spaced second features to form altered material on sidewalls of the spaced first features and on sidewalls of the spaced second features;
after the altering, removing the first features and the second features from the substrate; and
after removing the first features and the second features from the substrate, processing the substrate through a mask pattern comprising the altered material.

16. The method of claim 15 wherein the spaced first features comprise photoresist.

17. The method of claim 15 wherein forming the spaced first features comprises forming spaced mask features followed by laterally trimming the spaced mask features to reduce their respective widths.

18. The method of claim 17 wherein the mask pattern has pitch of about one fourth that of the spaced mask features.

19. The method of claim 15 wherein the second material has a planar outermost surface prior to any removing of the second material.

20. The method of claim 15 wherein the altering occurs during deposition of the alterable material.

21. The method of claim 15 wherein the altering occurs after completion of the deposition of the alterable material.

22. The method of claim 15 wherein no altering occurs until after completion of the deposition of the alterable material.

23. The method of claim 15 wherein the altering alters a portion of the alterable material adjacent each of the spaced first features and the spaced second features to form the altered material while leaving portions of the alterable material distal the spaced first features and the spaced second features unaltered.

24. The method of claim 23 comprising etching the distal portions away selectively relative to the altered material.

25. The method of claim 15 wherein the altering forms altered material over tops of the spaced first features and over tops of the spaced second features.

26. The method of claim 15 wherein the alterable material has a planar outermost surface.

27. A method of fabricating a substrate, comprising:
forming spaced first features over a substrate;
depositing an alterable material over the spaced first features and altering the alterable material with material from the spaced first features to form altered material on sidewalls of the spaced first features;
depositing a first material over the altered material which is of some different composition from that of the altered material;
removing only a portion of the first material to expose the altered material and form spaced first material;
after forming the spaced first material, etching the altered material from between the spaced first material and the spaced first features;
after the etching of the altered material, laterally trimming width of the spaced first material;
after the laterally trimming, forming anisotropically etched spacers on sidewalls of the spaced first features and on sidewalls of the spaced first material, the anisotropically etched spacers being of some different composition from that of the spaced first features and from that of the spaced first material;
after forming the anisotropically etched spacers, removing the spaced first features and the spaced first material from the substrate; and
after removing the spaced first features and the spaced first material from the substrate, processing the substrate through a mask pattern comprising the anisotropically etched spacers.

28. The method of claim 27 wherein the first material is of the same composition as that of the spaced first features.

29. The method of claim 27 wherein the first material is of some different composition from that of the spaced first features.

30. The method of claim 27 wherein the first material has a planar outermost surface prior to any removing of the first material.

31. The method of claim 27 wherein the spaced first features comprise photoresist and the alterable material comprises one or more inorganic components dispersed in an organic composition that is cross-linkable upon exposure to acid, wherein the material from the spaced first features includes acid, and the altering the alterable material comprises forming cross-links within the organic composition upon exposure to the acid in the material from the spaced first features.

32. The method of claim 31 wherein the one or more inorganic components includes silicon.

33. The method of claim 31 wherein the one or more inorganic components includes metal.

34. A method of fabricating a substrate, comprising:
forming spaced first features over a substrate;
depositing an alterable material over the spaced first features and altering only some of the alterable material with material from the spaced first features to form altered material on sidewalls of the spaced first features and leave alterable material elevationally over and between the altered material;
after the alternating, removing only a portion of the alterable material to expose the altered material and form spaced alterable material;
after forming the spaced alterable material, etching the altered material from between the spaced alterable material and the spaced first features;
after the etching of the altered material, laterally trimming width of the spaced alterable material;
after the laterally trimming, forming anisotropically etched spacers on sidewalls of the spaced first features and on sidewalls of the spaced alterable material, the anisotropically etched spacers being of some different composition from that of the spaced first features and from that of the spaced alterable material;
after forming the anisotropically etched spacers, removing the spaced first features and the spaced alterable material from the substrate; and
after removing the spaced first features and the spaced alterable material from the substrate, processing the substrate through a mask pattern comprising the anisotropically etched spacers.

35. A method of fabricating a substrate, comprising:
forming spaced first features over a substrate;
depositing a first alterable material over the spaced first features and altering the first alterable material with material from the spaced first features to form first altered material on sidewalls of the spaced first features;
depositing a first material over the first altered material which is of some different composition from that of the first altered material;
removing only a portion of the first material to expose the first altered material and form spaced first material;
after forming the spaced first material, etching the first altered material from between the spaced first material and the spaced first features;
after the etching of the first altered material, laterally trimming width of the spaced first material;
after the laterally trimming, depositing a second alterable material over the spaced first features and the spaced first material and altering the second alterable material with material from the spaced first features and with material from the spaced first material to form second altered material on sidewalls of the spaced first features and on sidewalls of the spaced first material;
after forming the second altered material, removing the spaced first features and the spaced first material from the substrate; and
after the removing of the spaced first features and spaced first material from the substrate, processing the substrate through a mask pattern comprising the second altered material.

36. The method of claim 35 wherein the first material has a planar outermost surface prior to any removing of the first material.

37. A method of fabricating a substrate, comprising:
forming spaced first features over a substrate;
depositing a first alterable material over the spaced first features and altering only some of the first alterable material with material from the spaced first features to form first altered material on sidewalls of the spaced first features and leave first alterable material elevationally over and between the first altered material;
after the altering of the first alterable material, removing only a portion of the first alterable material to expose the first altered material and form spaced first alterable material;
after forming the spaced first alterable material, etching the first altered material from between the spaced first alterable material and the spaced first features;
after the etching of the first altered material, laterally trimming width of the spaced first alterable material;
after the laterally trimming, depositing a second alterable material over the spaced first features and the spaced first alterable material and altering the second alterable material with material from the spaced first features and with material from the spaced alterable material to form second altered material on sidewalls of the spaced first features and on sidewalls of the spaced alterable material;
after forming the second altered material, removing the spaced first features and the spaced first alterable material from the substrate; and
after the removing of the spaced first features and spaced first alterable material from the substrate, processing the substrate through a mask pattern comprising the second altered material.

* * * * *